United States Patent
Tilton et al.

[11] Patent Number: 6,104,610
[45] Date of Patent: Aug. 15, 2000

[54] EMI SHIELDING FLUID CONTROL APPARATUS

[76] Inventors: Charles L. Tilton, P.O. Box 8; Bruce A Smetana, P.O. Box 15C, both of Colton, Wash. 99113

[21] Appl. No.: 09/354,757

[22] Filed: Jul. 29, 1999

[51] Int. Cl.[7] .................................................. H05K 7/20
[52] U.S. Cl. ..................... 361/699; 361/689; 361/698; 361/818; 257/714; 174/15.1; 174/356 C; 165/80.4; 165/104.33
[58] Field of Search .................................. 361/689, 698, 361/699–701, 818; 257/714; 174/15.1, 16.1, 356 C; 165/80.4

[56] References Cited

U.S. PATENT DOCUMENTS

| | | | |
|---|---|---|---|
| 4,900,877 | 2/1990 | Dubrow et al. | 174/35 GC |
| 5,412,536 | 5/1995 | Anderson et al. | 361/700 |
| 5,675,473 | 10/1997 | McDunn | 361/699 |
| 5,731,542 | 3/1998 | Limper-Brenner et al. | 174/52.4 |
| 5,838,551 | 11/1998 | Chan | 361/818 |
| 5,844,784 | 12/1998 | Moran et al. | 361/818 |
| 5,907,473 | 5/1999 | Przilas et al. | 361/699 |
| 5,943,211 | 8/1999 | Havey et al. | 361/699 |

Primary Examiner—Gerald Tolin
Assistant Examiner—Boris H. Chervinsky
Attorney, Agent, or Firm—David S. Thompson

[57] ABSTRACT

An EMI shielding fluid control shroud is adapted for use in spray cooling EMI producing or EMI sensitive components. The EMI shielding shroud, carried between a printed circuit board and a spray plate, defines an interior spray cavity which prevents interference with coolant spray directed at one or more heat-generating, EMI producing or sensitive components, such as integrated circuits. The size and shape of the shroud provide control over the flow and direction of the coolant spray and result in better cooling of the components carried on the printed circuit board and partially enclosed by the shroud. The shroud provides an EMI shield which prevents passage by EMI in either direction, while allowing coolant fluid to exit through the EMI shielding material.

9 Claims, 6 Drawing Sheets

EMI SHIELDING FLUID CONTROL APPARATUS

CROSS-REFERENCES

This application is related to application Ser. No. 09/255,415, filed Feb. 22, 1999.

BACKGROUND

Efficient and cost effective spray cooling of electronic assemblies requires high-density system packaging. Two problems related to high-density system packaging include heat removal and electromagnetic interference (EMI) shielding.

High density system packaging results in heat removal problems caused by liquid and vapor leaving the surfaces of integrated circuits (chips) interfering with and disrupting the sprays which are directed at the surfaces of the same and other chips. Liquid and vapor leaving one chip can cause poor heat-transfer performance in adjacent chips. This is particularly likely to occur in the very common circumstance where a high-powered chip, requiring a large volume flux of spray, is adjacent to one or more lower-powered chips requiring less spray volume. Fluid coating the high-powered chip's surface absorbs heat and leaves as a mixture of liquid and gaseous vapor. The volume and velocity of this fluid movement can be considerable, and due to lack of control over its direction and movement, it is particularly likely that it will interfere with the spray directed at adjacent chips. This interference can cause flooding of the device which inhibits thin film evaporation, thereby reducing the heat transfer performance. This can result in over-heating of these adjacent chips.

One possible solution is to increase the spray volume directed at lower-power chips. This solution is flawed for several reasons. First, excess coolant carried on the surface of the lower-powered chips can actually reduce the quantity of coolant which undergoes a heat-absorbing phase-change. Where more than a thin film is used to cover a heat generating component the rate of heat transfer is reduced. Secondly, the cumulative effect of an increased spray volume directed by several spray nozzles at several low-powered chips surrounding a high-power chip could result in undesired changes in the spray pattern directed at the high-powered chip. Thirdly, excessive spray requirements necessarily result in a requirement of greater pump capacity, overall greater coolant supply and an associated increase in costs. And finally, since the overall heat produced by the entire system can result in the vaporization of only a fixed quantity of liquid coolant, significantly exceeding that level of coolant supplied will result in a significant excess quantity of liquid coolant. In some applications, the spray module may tend to fill up with liquid. If this coolant is not properly directed, it could swamp chips in its flow pathway, thereby covering such chips with more than the optimal quantity of coolant for maximum efficiency in heat transfer.

A similar possible solution is to employ overlapping sprays to suppress the interference effect. However, in most applications the chips are not spaced in a manner that supports this strategy without unduly increasing the system flow rate requirements resulting in the above problems.

A further possible solution to the problem of interference between the spray directed at adjacent chips is to design the board in a manner in which minimization of this phenomena is a design parameter. However, this significantly increases design costs. More troubling still, it is possible that no arrangement of the chips on the board may result in a satisfactory design in many applications. Also, the design engineer and board layout technician may not be well-versed in thermal issues, and may be unable to achieve satisfactory results.

For the foregoing reasons, there is a need for a fluid control apparatus and method of use that can result in enhanced control over the direction and distribution of spray coolant in a manner that reduces or eliminates the interference caused by spray directed at a first chip with the spray and cooling process of a second chip.

A further problem facing electronic designers is related to EMI shielding. EMI shielding deals with two aspects of electromagnetic interaction, including electromagnetic emissions and electromagnetic susceptibility, i.e. susceptibility to such emissions. Electromagnetic interference (EMI) occurs when the emissions from one component adversely effect another component due to its susceptibility to the emissions.

Heat-generating electronic devices such as multi-chip modules, electronic hybrid assemblies such as power amplifiers and others passive system components, such as transformers or inductors, operating at high frequencies are frequently sources of electromagnetic emissions. An even wider number of active and passive components, such as preselect filters and receiver front end low noise amplifiers, are adversely effected by the EMI, and are therefore considered to be electromagnetically susceptible. EMI must therefore be attenuated to keep the system functioning properly. Similarly, governmental and other worldwide regulatory authorities have set forth requirements for EMI emissions that must be taken into consideration.

Electromagnetic compatibility may be attained where EMI emissions are attenuated or shielded by grounded enclosures and other similar shields which tend to enclose and isolate the EMI producing or EMI susceptible components. Unfortunately, such enclosure is inconsistent with the need to remove heat from the components to improve and maintain reliability. Similarly, isolation of individual components is expensive and is inconsistent with the need to consolidate and concentrate components into ever smaller enclosures.

A further engineering challenge associated with the trend to consolidate components into extremely small enclosures involves waste heat removal. New technologies involving spray cooling have allowed enclosure dimensions to be reduced, while increasing component density and yet maintaining thermal tolerances. Such spray cooling techniques involve use of an atomized spray of dielectric or electrically non-conducting fluid which typically undergoes a phase change from fine liquid droplets to a gas, thereby absorbing heat energy.

However, while such thermal techniques may allow component concentration, increasing component densities may also results in increased electromagnetic interaction which may increase exponentially as component separation distances are reduced. As a result, an apparatus which both shields groups of components for EMI and also provides spray cooling structures is known.

U.S. Pat. No. 5,675,473 discloses a cover made of a EMI-attenuating material, such as metal, which defines a compartment which supports a number of spray nozzles which direct spray at components carried within the enclosure.

Such a strategy does contain the EMI and also allows for heat removal. However, all components carried within the compartment are subject to the EMI produced by all of the components. As a result, the EMI problem is not solved, although EMI may be prevented from leaving the compartment.

Additionally, interaction between the spray emitted from adjacent nozzles may result in difficulties in adequately cooling all of the components.

What is needed is an EMI shielding fluid control apparatus for spray cooling that is adapted to isolate each EMI or heat producing component in a manner that allows for both heat removal and also EMI attenuation. The EMI shielding fluid control apparatus must allow spray coolant to move freely in manner that allows recycling, but must also provide a structure which is adapted to controlling the coolant spray direction, so that interaction between adjacent spray nozzles does not result in inadequate heat removal of any component.

SUMMARY

The present invention is directed to an apparatus that satisfies the above needs. A novel EMI shielding fluid control apparatus for spray cooling is disclosed that permits individual isolation of EMI sensitive components and EMI producing components, while also providing a structure for control over the direction and quantity of dielectric coolant spray in any specific area.

A preferred version of the fluid control apparatus for spray cooling of the present invention is adapted for support between a spray plate and a printed circuit board, whereby it may substantially enclose a component to be cooled, and includes some or all of the following structures.
(A) A preferred shroud includes a sidewall defining a spray cavity sized to enclose at least one generally conical spray of coolant mist discharged by the spray orifice of at least one atomizer defined on the surface of the spray plate.
(B) An inlet passage, defined in a portion of the sidewall adjacent to the spray plate, allows vapor to enter the spray cavity for movement generally in the direction of the spray of coolant mist.
(C) An effluent passage, defined in a portion of the sidewall adjacent to the printed circuit board, allows coolant to leave the spray cavity.
(D) Fastening means, carried by the shroud, maintains the shroud in position between the spray plate and printed circuit board or other device carrier, and may be adhesive or other type fastener. The shroud may be attached to either the spray plate to the printed circuit board, or to a chip carrier assembly of a large-scale integrated circuit.
(E) An EMI shield, attached by an EMI attenuating fastening adhesive to the shroud or to the spray plate and printed circuit board, prevents EMI passage through the shroud and also through the inlet and effluent passages, but allows coolant passage through the EMI shield.

It is therefore a primary advantage of the present invention to provide a novel EMI shielding fluid control apparatus for spray cooling which allows individual EMI shielding and protection of EMI producing and/or sensitive components without interfering with the flow of coolant through an EMI shrouding material.

Another advantage of the present invention is to provide a novel EMI shielding fluid control apparatus for spray cooling that provides a solution to heat-transfer problems caused by coolant flow disruption resulting from interference caused by adjacent atomizers and that does not utilize excessive coolant volume or depend on overlapping spray patterns to correct disruption in spray patterns.

Another advantage of the present invention is to provide a novel EMI shielding fluid control apparatus for spray cooling that provides a single layer or laminated shielding material that is radiation hard, and is therefore adapted to use in defense against nuclear weapons and for space applications.

A still further advantage of the present invention is to provide a EMI shielding fluid control apparatus for spray cooling having an EMI shrouding material that allows passage of coolant fluid, while preventing EMI passage, and which is defined in a structure that is adapted to cooling and EMI shielding one or more heat producing components.

DRAWINGS

These and other features, aspects, and advantages of the present invention will become better understood with regard to the following description, appended claims, and accompanying drawings where:

Figure 7:
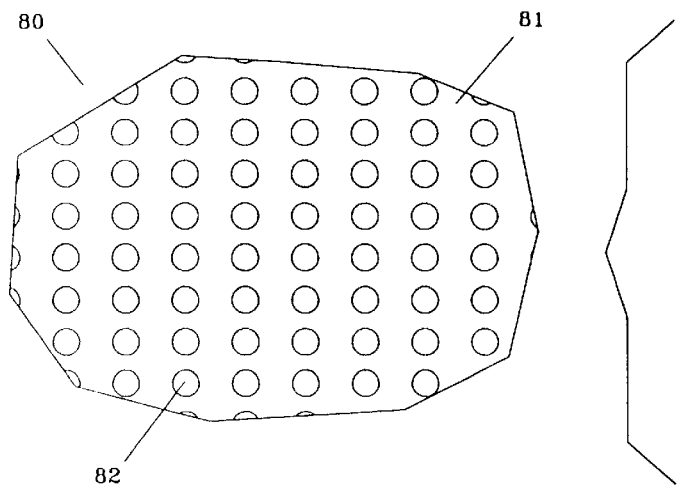
FIG. 7 is a plan view of a portion of an EMI shield.
Figure 7A:
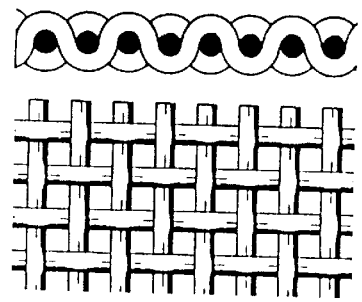

FIG. 7A includes a plan view and a side view of a portion of an EMI shield made of woven mesh.

Figure 8:
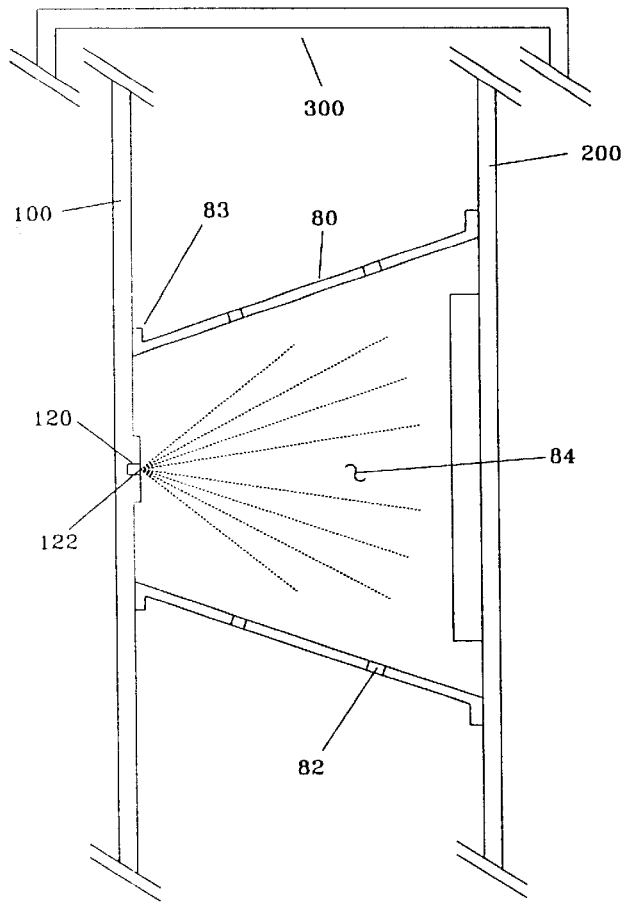

FIG. 8 is a cross-sectional view of an EMI shield with no shroud.

Figure 9:
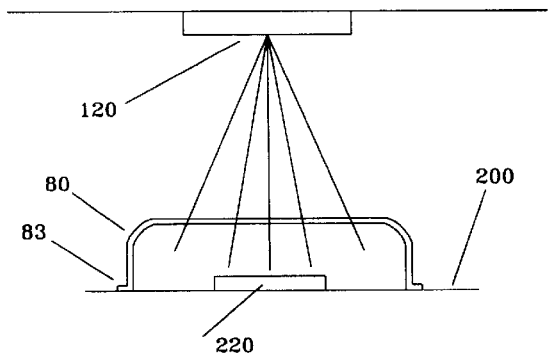

FIG. 9 is an alternate cross-sectional view of an EMI shield with no shroud.

Figure 10:
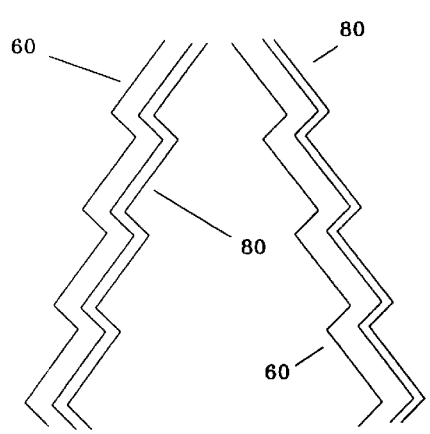

FIG. 10 is a version of a shroud and EMI shield which defines internal and external baffles to reflect, absorb and attenuate EMI.

Figure 11:
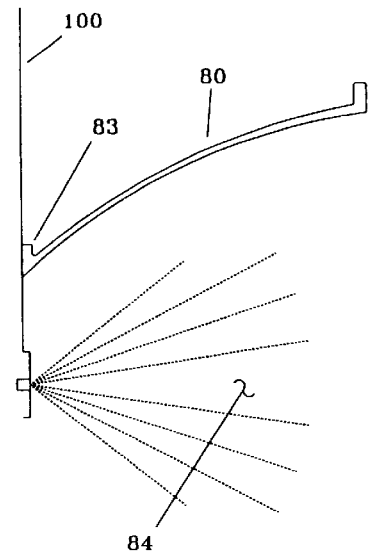

FIG. 11 is an alternate version of a shroud and EMI shield which is parabolic in shape to reflect, absorb and attenuate electromagnetic radiation.

DESCRIPTION

Figure 1:
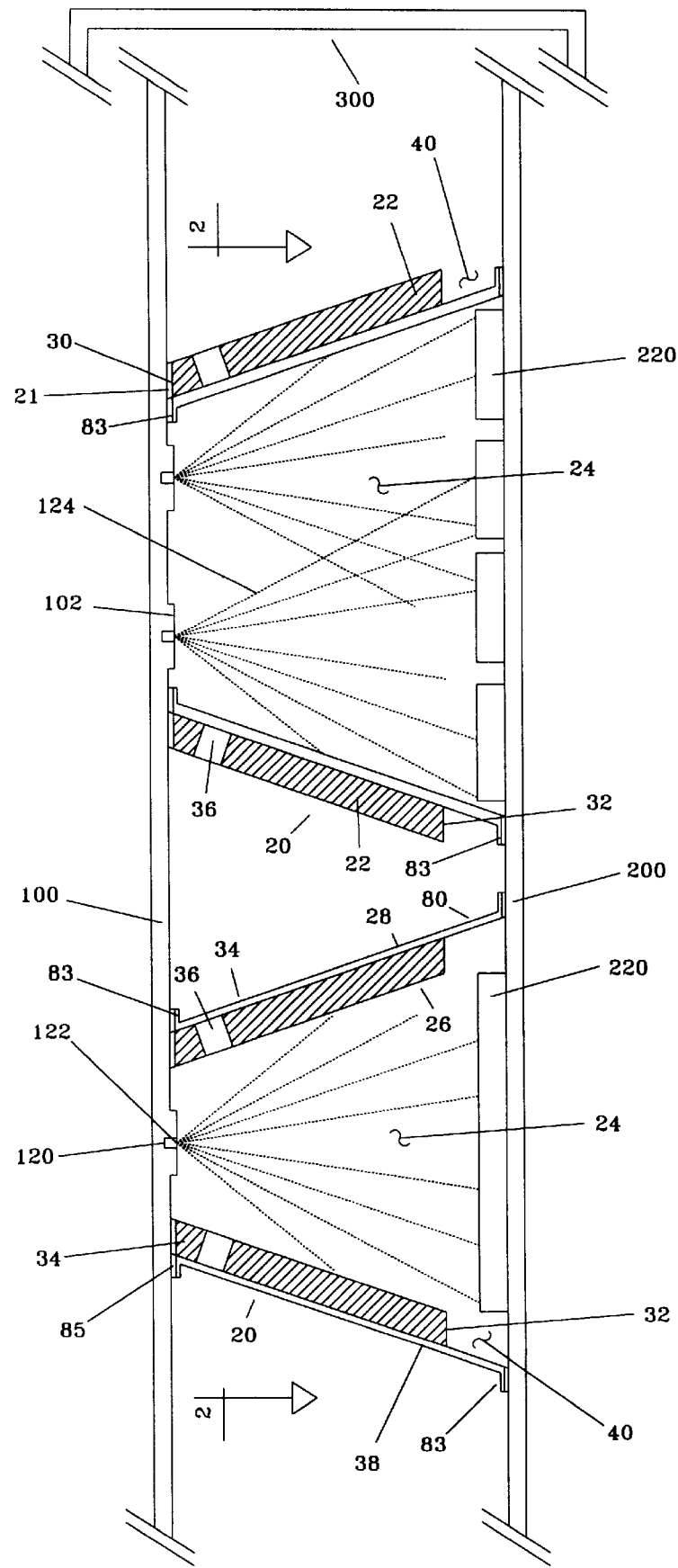
FIG. 1 is a side cross-sectional view of a spray plate carrying a version of the EMI shielding shroud of the invention and a printed circuit board supporting several integrated circuits.
Figure 2:
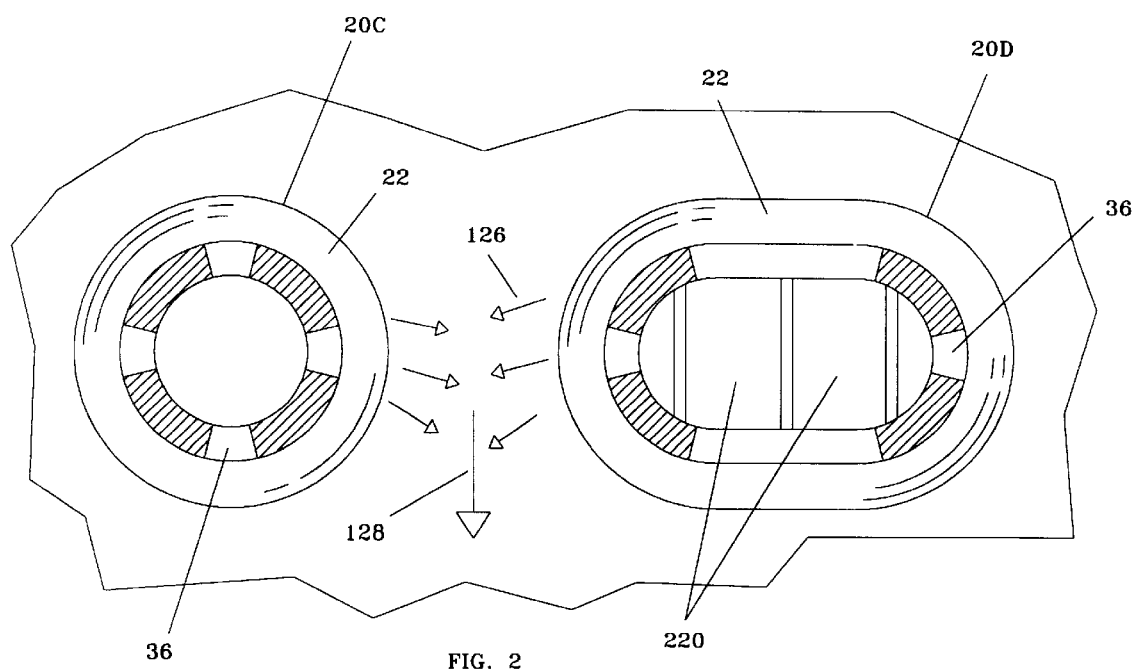
FIG. 2 is one version of a vertical cross-sectional view of the spray plate and shroud of FIG. 1 having a generally rectilinear configuration, taken along the 2—2 lines of FIG. 1.
Figure 3:
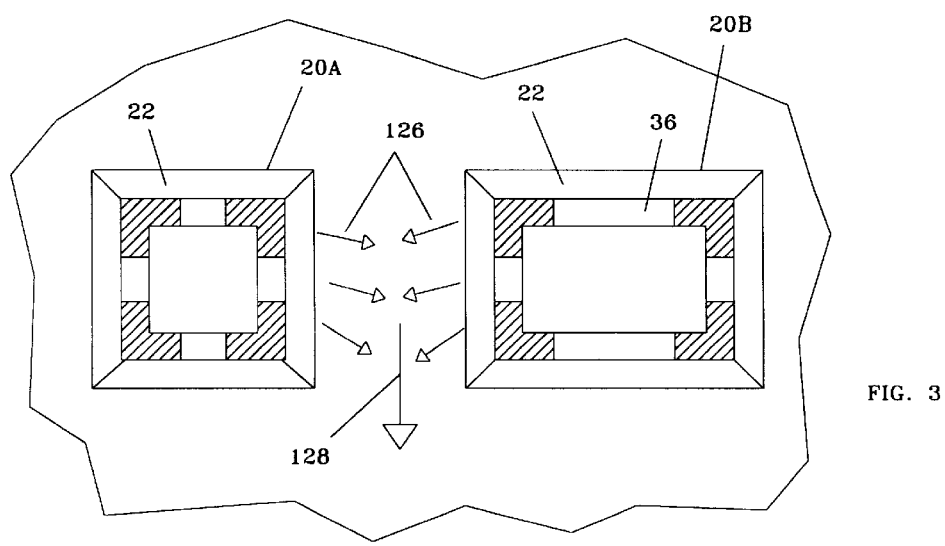
FIG. 3 is an alternate version of the vertical cross-sectional view of FIG. 2, having a rounded configuration.

Referring generally to FIGS. 1 through 3, a first version of an EMI shielding fluid control shroud 20 adapted for use in spray cooling EMI producing or EMI sensitive components is seen. The EMI shielding fluid control apparatus is adapted for use with a spray plate 100 having at least one atomizer 120 which cools one or more heat-generating components, such as integrated circuits 220, carried by a printed circuit board 200. At least one spray plate and printed circuit board are carried within a coolant-tight enclosure such as a spray module 300. In a typical application, a fluid control shroud 20 is supported by the spray plate or by the printed circuit board. The shroud 20 encloses a spray cavity 24 and provides control over the flow and direction of the spray coolant leaving the atomizers enclosed by the shroud. The size and shape of the shroud provide control over the flow and direction of the coolant spray and results in better cooling of the components carried on the printed circuit board and enclosed by the EMI shielding shroud. The shroud provides an EMI shield 80 which prevents passage by EMI in either direction, while allowing coolant fluid to exit through the EMI shielding material.

Referring particularly to FIGS. 1 through 3, the spray plate-mounted shroud 20 is seen. As seen in FIG. 1, the shroud is supported by the spray plate 100 and provides sidewalls 22 which define a spray cavity 24. The EMI shield 80 is typically attached to the spray plate, the printed circuit board and sidewalls of the shroud, thereby enclosing the components. As oriented in FIG. 1, the spray cavity is also bounded on the left by the spray plate 100 and on the right by the printed circuit board 200. The sidewalls 22 enclosing the spray cavity 24 include inner and outer surfaces 26, 28. A portion 34 of the sidewall is adjacent to the spray plate 100, and a portion 38 of the sidewall is adjacent to the printed circuit board 200.

In this embodiment of the shroud, an edge 30 of the sidewall 22 of the shroud 20 is attached to the spray plate 100 by EMI adhesive 21 or other EMI fastening means.

As seen in FIG. 1, an edge 32 of the sidewall 22 adjacent to the printed circuit board is parallel to and a short distance from the printed circuit board 200. The gap between the lower edge 32 of the shroud 20 and the printed circuit board 200 defines an effluent passage 40 which allows coolant and vapor to exit from the spray cavity 24. The area of the effluent passage should be calculated to allow for adequate coolant flow out of the spray cavity 24 even when the flow through the effluent passage is reduced slightly by friction with the EMI shield 80.

One or more inlet passages 36 are defined in the portion 34 of the sidewall adjacent to the spray plate. As seen in FIGS. 1 through 3, the inlet passages 36 of a preferred version are typically narrow slots having a lengthwise component oriented parallel to the spray plate. Alternatively, holes or other mesh openings could be substituted for the slots illustrated to increase EMI shielding. The inlet passages 36 allow the passage of vapor into the spray cavity 24, which tends to promote better directional control over the spray of coolant mist 124 because the vapor relieves the negative pressure gradient caused by the spray.

As seen in FIGS. 2 and 3, four illustrative examples of the shape of the shroud 20 are disclosed. Referring to the shroud 20A on the left side of FIG. 2, it is seen that the shroud may be generally conical in shape, having the tip of the cone removed. Referring to the shroud 20B on the right side of FIG. 2, it is seen that the shroud may be oval in shape, with sloping or curved side walls. Referring to the shroud 20C on the left side of FIG. 3, it is seen that the shroud may be pyramid-like in shape, having the upper tip of the pyramid removed. And, referring to the right side of FIG. 3, it is seen that the shroud 20D may be pyramid-like with a rectangular cross-section, also having the tip of the pyramid removed.

As seen above, the EMI shield 80 is typically attached to the spray plate, the printed circuit board and sidewalls of the shroud, thereby enclosing the components carried within the shroud. The EMI shield greatly attenuates EMI passing through the EMI shield in either direction. However, the EMI shield allows coolant to pass from the spray cavity 24 defined within the shroud 20. Coolant passing through the EMI shield and out of the shroud is recycled, allowing the coolant to again be released by the atomizers 120 of the spray plate 100.

EMI generated by a component within the spray cavity of the shroud 20 is contained within the shroud by the EMI shield. Similarly, EMI sensitive components within an EMI shroud are protected from EMI generated outside the shroud. Most of the EMI is prevented from passing through the spray plate 100 by the layers used to construct the spray plate, which are typically manufactured from metal that has been chemically etched or mechanically machined. Similarly, EMI is attenuated from passing through the printed circuit board 200 by the ground plane or similar conducting surface.

EMI is also prevented from passing through the shroud 20 by the EMI shield 80 carried by the shroud. A portion of a preferred version of the EMI shield 80 is seen in FIG. 7. The EMI shield is formed from a metallic screen or perforated sheet having a body 81 defining holes or openings 82. The body attenuates the passage of EMI in either direction through the EMI shield, while the openings 82 allow coolant to pass through the shield.

The printed circuit board adapted for use with all versions of the invention may include a micro-line or strip-line circuit board layout technique. This would include a guard ring defined in the area in which the EMI shield is attached to the circuit board. By attaching the EMI shield directly to the guard ring, which is in communication with a ground plane defined between layers of the circuit board, EMI would not leak through the connection between the EMI shield and the circuit board.

An important characteristic of the EMI shield 80 is that EMI is attenuated when passing through the shield in either direction, while coolant is able to pass through the openings 82 in the shield.

As seen in FIG. 7, a version of the EMI shield is made of metal having openings 82 defined through the material. Alternatively, as seen in FIG. 7A, the EMI shield may be made of woven metal mesh having openings 82 which are of a suitable size. The use of metal to form the EMI shield attenuates EMI in a manner similar to the use of a metal ground plane to contain or shield EMI.

Figure 4:
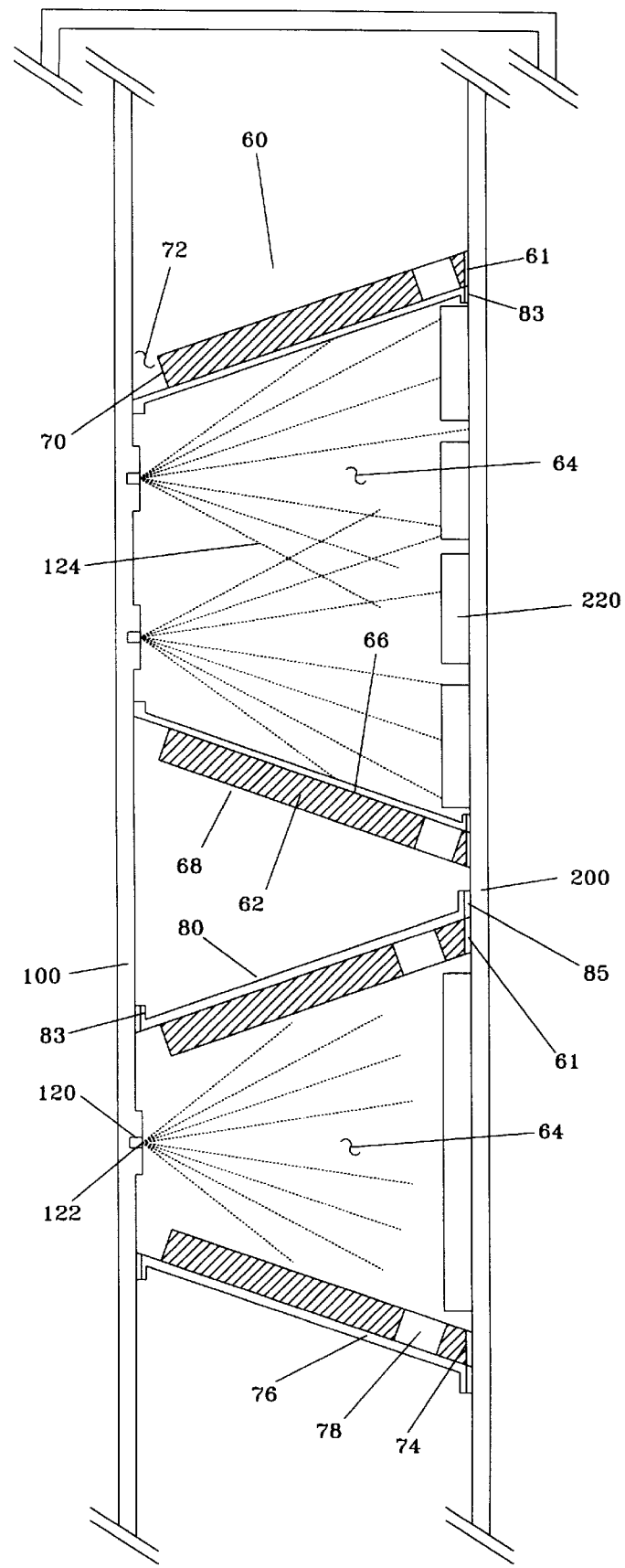
FIG. 4 is a side cross-sectional view of a second version of the EMI shielding shroud carried by a printed circuit board.
Figure 5:
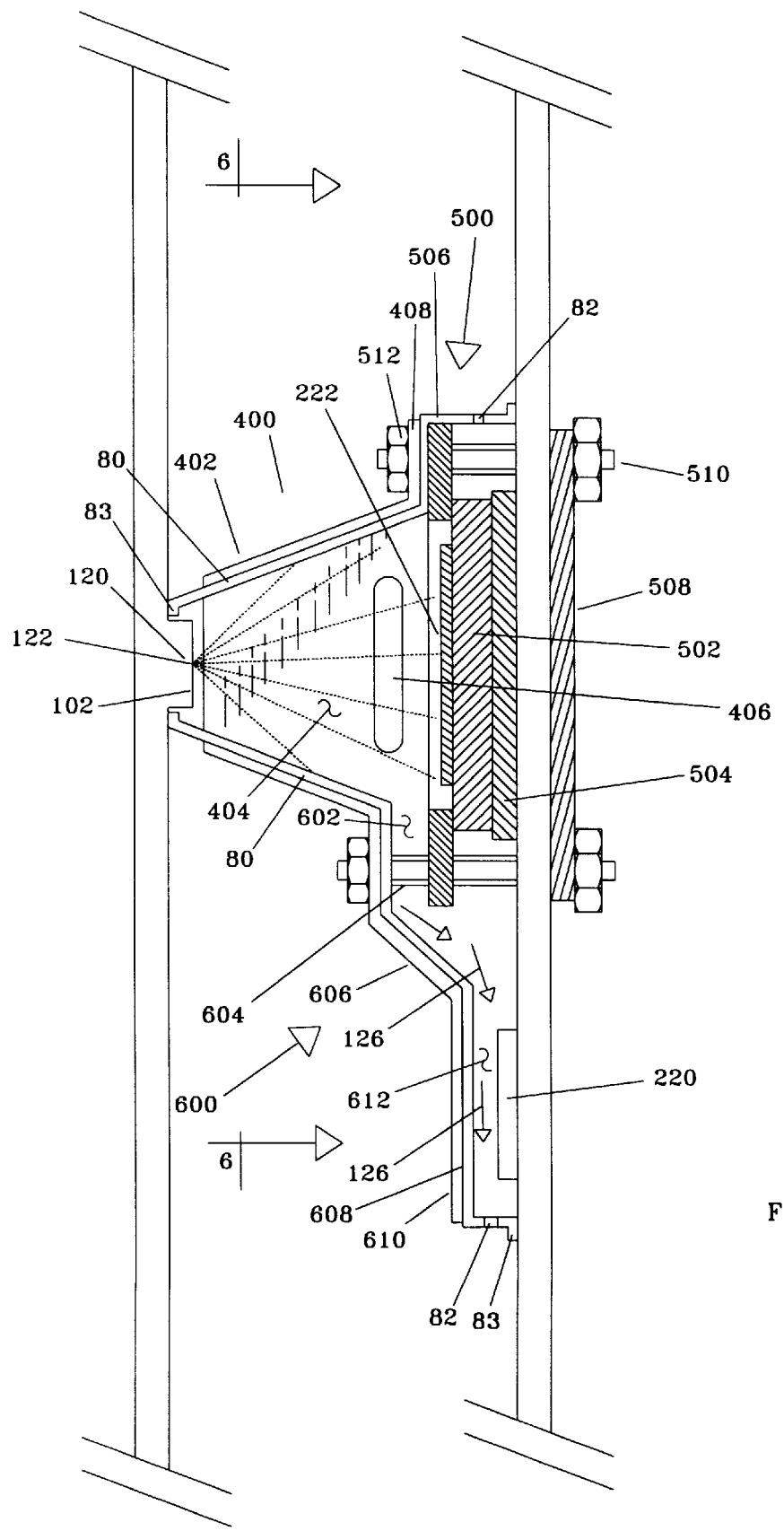
FIG. 5 is a side cross-sectional view of a third version of the EMI shielding shroud, carried adjacent to the chip carrier assembly of a large-scale integrated circuit, and also showing a secondary EMI shielding shroud, extending from the third version of the shroud.

As seen in FIGS. 1, 4 and 5, the EMI shield should be held adjacent to the spray plate 100 and to the printed circuit board 200. In a typical application, the EMI shield is fastened to the spray plate and to the printed circuit board by EMI attenuating adhesive 85 or other fastening means which greatly attenuate EMI passage. Such fasteners must follow the guide lines set forth below for maximum gap size allowed in holes 82 of shield 80. Flanges 83 may be formed from an edge portion of the shield and attached to the spray plate and to the printed circuit board. The flange provides the surface area required for EMI fastening, and is designed to prevent EMI from leaking through the point of attachment between the EMI shield and the spray plate or printed circuit board.

The size of the openings 82 should be designed to prevent EMI passage while allowing coolant passage. The size of the openings 82 and the radiated transverse electromagnetic wave of the EMI are related. For example, EMI having a fundamental frequency of 15 giga Hertz will have a wave length of approximately 20 mm. This wavelength and any larger wave lengths will be greatly attenuated when passing through an EMI shield where the size of the openings 82 have a radius of 0.7 mm or smaller.

Another example of an EMI shield is a fine wire mesh screen. To ensure adequate two-phase flow through the EMI shield, a wire mesh grid with 0.076 mm diameter wire and square openings having a side length of 0.127 mm is selected. For purposes of making calculations, the square opening is compared to a circular opening having a diameter equal to the diagonal measure of across the square. Using this grid size in a wire screen mesh will effectively attenuate a radiated TEM wave with a fundamental frequency of 1 Tera-Hertz or less. This example is a first order empirical approximation guideline for the design of electromagnetic shielding.

Where the openings are not round, as in the case where the body is constructed of woven metal wire, it will be assumed that the associated "diameter" is the diameter of a circle that would be required to enclose the entire non-round opening.

To provide for adequate levels of coolant flow, the size of the openings 82 should generally be maximized, given the constraint that the EMI be blocked, to reduce the friction of the coolant passing through the openings. A two-phase flow (e.g. gas and liquid) of coolant should be able to pass through the openings. For example, where the openings have a diameter of approximately equal to the examples seen above, coolant will be able to flow through the shroud at an adequate rate. The effluent passages 40, 78 should be sized to allow for adequate passage of coolant given the circumstances of the application. The size of the effluent passages for any given application will depend on the heat generated by the component, the corresponding level of coolant required for heat removal, the degree to which the coolant used undergoes a phase change to gas and the size of the openings 82 in the EMI shield.

As seen in FIG. 1, in a preferred spray plate 100 the atomizer 120 may be defined in an elevated pad 102. In the event that the spray module is oriented so that gravity may cause a slight pooling of coolant fluid, the pad prevents an accumulation of fluid from covering the spray orifice 122 of the atomizer 120.

Referring to FIG. 4, a version of the shroud supported by the printed circuit board is seen. As illustrated in FIG. 4, the alternate shroud 60 is supported by the printed circuit board 200 and provides sidewalls 62 which define a spray cavity 64. As oriented in FIG. 4, the spray cavity is also bounded on the left by the spray plate 100 and on the right by the printed circuit board 200. The spray cavity is sized to enclose one or more heat-producing components.

The sidewalls 62 enclosing the spray cavity 64 include inner and outer surfaces 66, 68. An edge 70 of the sidewall adjacent to the spray plate is spaced a narrow distance from the spray plate. The space between the edge 70 and the spray plate forms an inlet passage 72 which allows vapor to enter the spray cavity. An edge 74 of the sidewall is connected to the printed circuit board 200 by adhesive 61 or other fastening means.

One or more effluent passages 78 are defined in a portion 76 of the sidewall near the printed circuit board. In a manner similar to the inlet passages of the version of the shroud of FIGS. 1–3, the effluent passages 78 are typically narrow slots having a lengthwise component oriented parallel to the printed circuit board 200. Alternatively, holes or other openings could be substituted for the preferred slots. In any configuration, the area of the effluent passages should be calculated to allow for adequate coolant flow out of the spray cavity 64 even when the flow through the effluent passage is slightly reduced by the EMI shield 80.

As seen by a comparison of FIGS. 1 and 4, the EMI shield 80 associated with the shroud of FIG. 1 is substantially similar to the EMI shield 80 associated with the shroud of FIG. 4. In both versions of the invention, the EMI shield 80 must extend from the spray plate to the printed circuit board.

Also, as seen in both FIGS. 1 and 4, the EMI shield may be carried by the inside surfaces 26, 66 of the sidewalls 22, 62 of the shroud 20, 60 or on the outside surfaces 28, 68. In both cases the flanges 83 should be EMI adhered to the spray plate 100 and the printed circuit board.

Figure 6:
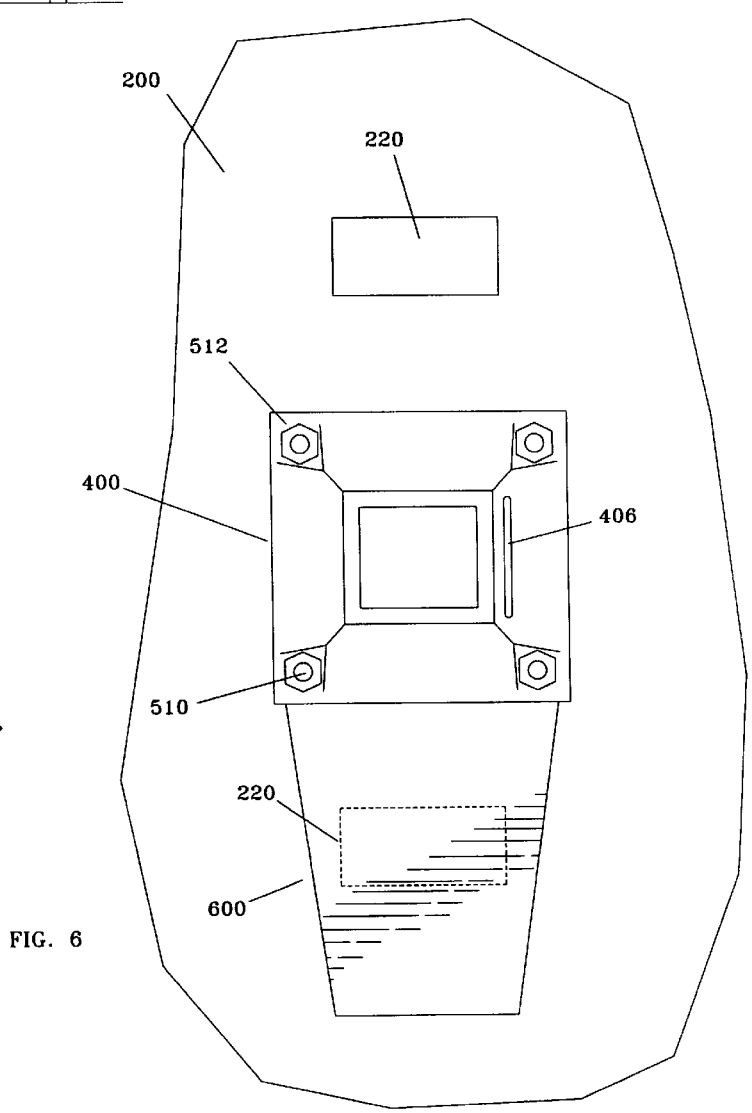
FIG. 6 is a top view of the shroud and secondary shroud of FIG. 5.

As seen in FIGS. 5 and 6, a version of the shroud 400 is adapted for support by the chip carrier assembly 500 associated with a very large scale integrated circuit 222, such as a microprocessor. The chip carrier assembly typically includes a chip carrier 502, an I/O interface pad 504, a pressure plate 506, a backing plate 508 and associated hardware. In many applications, a large, high power consuming integrated circuit will be mounted on a chip carrier 502. The chip carrier may be mounted on an I/O interface pad (compliant interconnect) 504, which is in turn carried by a first side of the printed circuit board 200, where electrical connections are made. The chip carrier 502, the interface pad 504 and the printed circuit board are squeezed between a pressure plate plate 506 and a backing plate 508. Typically, the pressure plate contacts a perimeter portion of the chip carrier, located on a first side of the printed circuit board. The backing plate is located on a second side of the printed circuit board opposite the interface pad. Support bolts 510 and associated fasteners such as nuts 512 secure the pressure plate 506 and backing plate 508.

As seen in FIGS. 5 and 6, a version of the chip carrier-mounted shroud 400 directs the spray from one or more spray nozzles onto the surface of a large integrated circuit 222, and is adapted for support by the chip carrier assembly 500. The chip carrier-mounted shroud typically includes a sloping sidewall 402 which encloses a chamber 404 within which the spray of coolant mist 124 from one or more spray orifices 122 is protected from the destructive influence of adjacent atomizers.

The sloping sidewalls define one or more discharge slot openings 406. The discharge openings allow effluent 126 to exit the chamber 404. The size, location and distribution of the discharge openings may be selected with reference to the nature and distribution of adjacent components. Such selection will result in the direction of the effluent 126 in a manner which cools or does not interfere with the cooling of the adjacent components.

A shroud base 408 typically defines holes which may be used to anchor the shroud 400 to the support bolts 510 of the chip carrier assembly 500.

As seen in FIG. 5, the EMI shield associated with the version of the invention adapted to a shroud supported by a chip carrier is constructed in a manner similar to the EMI shields associated with previous versions of the invention. The EMI shield is attached to the spray plate and to the printed circuit board, and may be carried on the inside or outside surface of the chip carrier shroud.

As seen in FIG. 5, a secondary chip mounted shroud 600 may be carried by the support bolts 510 or may be an integral extension of the chip carrier mounted shroud 400. The secondary shroud directs effluent 126 leaving the chamber 404 through path 612 over adjacent integrate circuits 220 in an orderly manner. In a typical application, the secondary shroud may replace one or more discharge slots 406 as a means of discharging effluent from the chamber 404.

As seen particularly in FIG. 5, a stand-off 604 allows separation of the pressure plate and the shroud, thereby forming a passage 602 between the base of the shroud and the pressure plate, allowing the effluent to pass from the chamber 404 through path 612. A ramp 606 directs the effluent toward the printed circuit board, along a path 612 between the lower surface 608 and the printed circuit board, where the effluent passes by chips 220 adjacent to the large scale integrated circuit 222. Where there is spray coolant mist from nearby atomizers, such mist tends to deflect off the upper surface 610 of the secondary shroud, and does not interfere with the effluent movement 126 as seen in FIG. 5.

Continuing to refer to FIG. 5, the structure of the EMI shield 80 associated with the secondary shroud is seen. The EMI shield may be carried by the inside or outside surface of the secondary shroud 600, as desired.

As seen in FIG. 8, an EMI shield 80 may be carried between the spray plate and printed circuit board 200 without a supporting shroud. Such a structure would be indicated where interference from adjacent atomizers 120 was not a problem, and use of a shroud was therefore unnecessary to manage the direction and distribution of the sprays of coolant mist 124. Such an EMI shield allows coolant to flow though it, but does not allow passage of EMI in either direction.

The spray cavity 84 defined within the EMI shield should enclose at least one atomizer 120 and its associated spray of coolant mist 124. The spray mist should be directed toward at least one electromagnetic emitting or electromagnetic susceptible component 220 enclosed within the spray cavity 84.

The EMI shield 80 would be constructed having openings 82 defined in the body 81 having dimensions related to the frequency of EMI of concern as seen above. The EMI shield would attach to the spray plate and printed circuit board as seen above, in a manner that would prevent EMI passage.

As seen in FIG. 9, an alternative version of the EMI shield seen in FIG. 8 encloses the integrated circuit or electronic subassembly and a portion of the printed circuit board, but does not enclose a portion of the spray plate. This version of the EMI shielding means is carried between the circuit board and spray plate, and is typically attached to the circuit board.

As seen in FIG. 11, any of the EMI shields 80 and associated shrouds 60 of the various versions of the invention may be made in a parabolic shape to cancel or direct EMI, as desired. The shape of the shroud may be used to control traveling waves within the shroud. The shape of the shroud and EMI shield can be designed in a parabolic or bowl or other shape for the purpose of directing a reflected wave. This would provide a direction for the reflected wave resulting from the incident wave striking a surface to reflect in a direction towards another shield such that the wave does not travel directly back toward the emission source.

As seen in FIG. 10, either or both of the inside and outside surfaces 26, 28 of the shroud 60 and EMI shield 80 can be formed of a shape that would reflect EMI in a manner analogous to sound absorbing baffles. After being reflected sufficiently, the intensity of the EMI would be reduced.

A still further version of the EMI shielding fluid control apparatus is for enhanced shielding for radiation hardening. In this application, the shroud could be constructed of known materials that are resistant to radiation, to thereby shield sensitive electronics from radiation exposure. Such radiation could be encountered in space or on earth due to nuclear or sunspot activity.

In operation, a shroud having a size and shape resulting in a spray cavity sized to enclose one or more high heat-producing components is selected. Isolation of the heat-producing components within the shroud allows for better control over the flow of coolant spray 124 directed at those components and also prevents the spray from interfering with other coolant sprays directed at other components.

As seen in FIG. 1, a spray of coolant mist 124 forms a thin coating on the heat-producing components. The mist tends to spray the entire area of the printed circuit board within the spray cavity 24 and also some of the inside surfaces 26 of the sidewalls 22.

Referring to FIGS. 2 and 3, a high-speed effluent 126, comprising coolant fluid and vapor, exits the spray cavity 24 through the effluent passage 40. A fluid return passage 128 between shrouds 20 and unshrouded components allows the vapor and coolant fluid to return to a heat exchange reservoir where it may be fully condensed and pumped under pressure to the atomizers 120 of the spray plate 100.

The EMI shield 80 associated with the shroud is selected to have openings 82 having a diameter or area that is too small to allow the passage of EMI having a frequency in a range of that is produced by, and/or that would interfere with, operation of the components enclosed by the shroud. The EMI shield may be attached to either the inside surface or outside surface of the shroud, as desired. The flanges 83 of the body 81 of the shroud are attached to the spray plate and to the printed circuit card The previously described versions of the present invention have many advantages, including a primary advantage of providing a novel EMI shielding fluid control apparatus for spray cooling which allows individual EMI shielding and protection of EMI producing and/or sensitive components without interfering with the flow of coolant through an EMI shrouding material.

Another advantage of the present invention is to provide a novel EMI shielding fluid control apparatus for spray cooling that provides a solution to heat-transfer problems caused by coolant flow disruption resulting from interference caused by adjacent atomizers and that does not utilize excessive coolant volume or depend on overlapping spray patterns to correct disruption in spray patterns.

A still further advantage of the present invention is to provide a EMI shielding fluid control apparatus for spray cooling having an EMI shrouding material that allows passage of coolant fluid, while preventing EMI passage, and which is defined in a structure that is adapted to cooling and EMI shielding one or more heat producing components.

Although the present invention has been described in considerable detail and with reference to certain preferred versions, other versions are possible. For example, while shrouds having a conic-section or pyramid-like shape have been disclosed, it is clear that other shapes could be substituted. For example, a complex shape wrapping about several heat-producing components could be substituted. Also, the shroud of FIGS. 1 through 6 can alternatively be mounted on a multi-chip module (MCM) or other component or integrated circuit supporting device. In a still further alternative, the shroud may be supported or mounted on a flange or bracket extending from the enclosure containing the spray coolant, the card cage supporting the printed circuit boards, MCMs or other component-supporting device, or from any convenient location. The EMI shield may be formed with holes of any shape, provided that the size of the holes may be completely enclosed by a circle having a diameter calculated as seen above. The EMI shield may be made in a generally parabolic shape to cancel reflected waves. Therefore, the spirit and scope of the appended claims should not be limited to the description of the preferred versions disclosed.

In compliance with the U.S. Patent Laws, the invention has been described in language more or less specific as to methodical features. The invention is not, however, limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An EMI shielding fluid control apparatus for controlling the coolant flow between a spray plate and a printed circuit board carrying at least one component to be cooled, the EMI shielding fluid control apparatus comprising:
   (A) a spray plate;
   (B) at least one atomizer, carried by the spray plate;
   (C) a printed circuit board;
   (D) a shroud having a sidewall defining a spray cavity sized to enclose at least one generally conical spray of coolant mist discharged by at least one atomizer defined on a surface of the spray plate;
   (E) inlet passage means, in communication with the spray cavity, for allowing vapor to enter the spray cavity for movement in a direction following the spray of coolant mist;
   (F) effluent passage means, in communication with the spray cavity, for allowing vapor and coolant to leave the spray cavity;
   (G) fastening means for maintaining the shroud in a position between the spray plate and printed circuit board adjacent to the at least one component to be cooled; and
   (H) an EMI shield means, carried by the shroud, for preventing EMI passage but for allowing coolant passage.

2. The EMI shielding fluid control apparatus of claim 1, wherein the shroud is fastened to the spray plate.

3. The EMI shielding fluid control apparatus of claim 1, wherein the shroud is fastened to the printed circuit board.

4. The EMI shielding fluid control apparatus of claim 1, wherein the shroud is made of a radiation hardened material.

5. An EMI shielding fluid control apparatus for controlling the coolant flow between a spray plate and a printed circuit board carrying at least one component and a chip carrier assembly to be cooled, the EMI shielding fluid control apparatus comprising:
   (A) a spray plate;
   (B) at least one atomizer, carried by the spray plate;
   (C) a printed circuit board;
   (D) a shroud having a sidewall defining a spray cavity sized to enclose at least one generally conical spray of coolant mist discharged by at least one atomizer defined on a surface of the spray plate;
   (E) inlet passage means, In communication with the spray cavity, for allowing vapor to enter the spray cavity for movement in a direction following the spray of coolant mist;
   (F) effluent passage means, In communication with the spray cavity, for allowing vapor and coolant to leave the spray cavity;
   (G) fastening means for maintaining the shroud in a position between the spray plate and printed circuit board adjacent to the at least one component to be cooled, wherein the fastening means attaches to the chip carrier assembly;
   (H) an EMI shield means, carried by the shroud, for preventing EMI passage but for allowing coolant passage; and
   (I) secondary shroud means, adjacent to the shroud, for directing the effluent leaving the spray cavity along a path defined between the secondary shroud means and the printed circuit board.

6. An EMI shielding fluid control apparatus controlling the coolant flow between a spray plate and a printed circuit board carrying at least one component to be cooled, the EMI shielding fluid control apparatus comprising:
   (A) a shroud having a sidewall defining a spray cavity sized to enclose at least one generally conical spray of coolant mist discharged by at least one atomizer defined on a surface of the spray plate;
   (B) inlet passage means, in communication with the spray cavity, for allowing vapor to enter the spray cavity for movement in a direction following the spray of coolant mist;
   (C) effluent passage means, in communication with the spray cavity, for allowing vapor and coolant to leave the spray cavity;
   (D) fastening means for maintaining the shroud in a position between the spray plate and printed circuit board adjacent to the at least one component to be cooled; and
   (E) an EMI shield means, carried by the shroud, for preventing EMI passage but for allowing coolant passage.

7. The EMI shielding fluid control apparatus of claim 6, wherein the shroud is fastened to the spray plate.

8. The EMI shielding fluid control apparatus of claim 6, wherein the shroud is fastened to the printed circuit board.

9. The EMI shielding fluid control apparatus of claim 6, wherein the shroud is made of a radiation hardened material.

* * * * *